United States Patent
Zuck

(10) Patent No.: US 7,267,132 B2
(45) Date of Patent: Sep. 11, 2007

(54) METHODS FOR REMOVING SILICON AND SILICON-NITRIDE CONTAMINATION LAYERS FROM DEPOSITION TUBES

(75) Inventor: David S. Zuck, Coppell, TX (US)

(73) Assignee: Quantum Global Technologies, LLC, Dublin, PA (US)

( * ) Notice: Subject to any disclaimer, the term of this patent is extended or adjusted under 35 U.S.C. 154(b) by 0 days.

(21) Appl. No.: 11/054,794

(22) Filed: Feb. 9, 2005

(65) Prior Publication Data

US 2005/0217705 A1  Oct. 6, 2005

Related U.S. Application Data

(63) Continuation of application No. 10/818,663, filed on Apr. 5, 2004.

(51) Int. Cl.
 *B08B 3/00* (2006.01)
(52) U.S. Cl. ............ 134/149; 134/137; 134/152; 134/157; 134/166 R; 134/170; 134/201; 134/902; 438/905; 156/345.23

(58) Field of Classification Search ............ 134/22.1, 134/22.18, 137, 157, 166 R, 170, 902, 2, 134/3, 22.11, 32, 149, 152, 201, 41; 438/905
See application file for complete search history.

(56) References Cited

U.S. PATENT DOCUMENTS

| 2,163,276 | A | * | 6/1939 | Fritzsche et al. | ........... 134/157 |
| 2,273,603 | A | * | 2/1942 | Verden | ........... 134/23 |
| 3,420,712 | A | * | 1/1969 | Parsons | ........... 134/33 |
| 6,607,605 | B2 | | 8/2003 | Tan | |

FOREIGN PATENT DOCUMENTS

| DE | 80924 A | * | 2/1970 |
| GB | 1323416 | * | 7/1973 |
| JP | 54-138827 | * | 10/1979 |
| JP | 4-180875 | * | 6/1992 |

* cited by examiner

*Primary Examiner*—M. Kornakov
(74) *Attorney, Agent, or Firm*—Silicon Edge Law Group LLP; Arthur J. Behiel

(57) ABSTRACT

Described are methods, systems, and chemistries for removing layers of stubborn silicon and silicon-nitride contamination layers from the inside surfaces of such articles as deposition tubes. In such embodiments, a tube to be cleaned is gently rolled on it side while a portion the tube's interior surface is exposed to an etchant. The tube is only partially filled with etchant to reduce the requisite etchant volume, and the rolling motion evenly exposes the contaminated inner surface to the etchant.

11 Claims, 8 Drawing Sheets

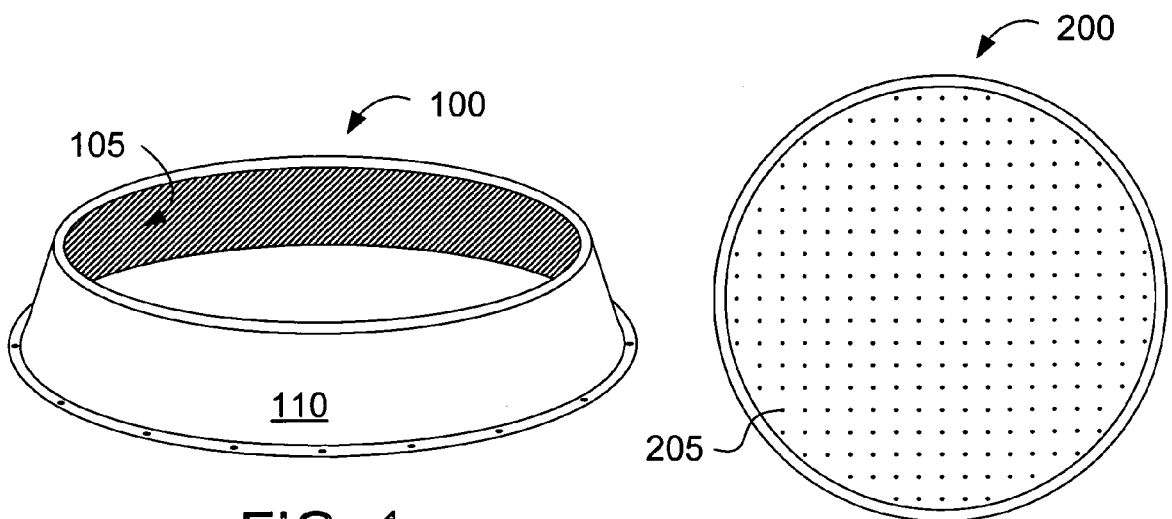
FIG. 1
(PRIOR ART)
FIG. 2
(PRIOR ART)
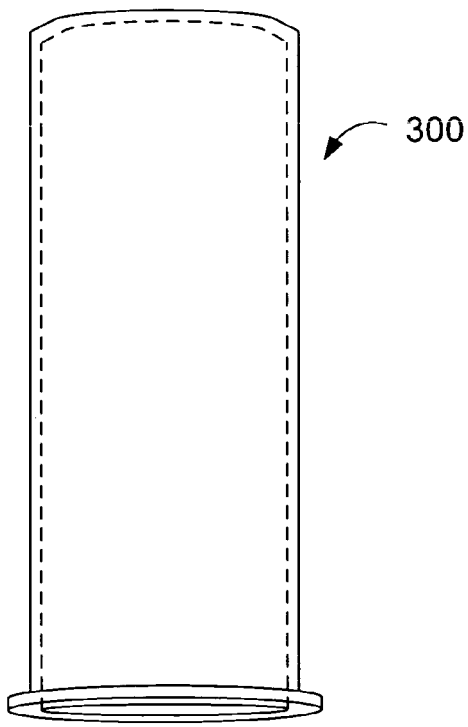
FIG. 3 (PRIOR ART)

METHODS FOR REMOVING SILICON AND SILICON-NITRIDE CONTAMINATION LAYERS FROM DEPOSITION TUBES

BACKGROUND

Semiconductor devices are built up using a number of material layers. Each layer is patterned to add or remove selected portions to form circuit features that will eventually make up an integrated circuit. Some layers can be grown from another layer; for example, an insulating layer of silicon dioxide can be grown over a layer of silicon by oxidizing the silicon surface. Other layers are formed using deposition techniques, typical ones being chemical vapor deposition (CVD), evaporation, and sputtering.

Deposition methods form layers using vaporized materials that condense to form a film on the surface of interest. Unfortunately, the films thus formed are not limited to the surface of interest, but tend also to form on other surfaces within the reaction chamber. Thus, after substantial use, a thick film of the deposited material accumulates on components and surfaces within the reaction chamber. These films eventually become troublesome sources of contaminants. Etch processes also contaminate inside surfaces of reaction chambers, though by different mechanisms. In either case, the reaction chamber, including internal components, must be periodically cleaned or replaced.

Many process contaminants are removed using hazardous liquids. Unfortunately, the storage, use, and disposal of hazardous liquids and their vapors are dangerous and expensive, particularly when these chemicals are used in large volumes. There is therefore a need for cleaning methods and systems that minimize the required amounts of hazardous chemicals.

The difficulty and expense of dealing with hazardous chemicals are not the only problems encountered when cleaning semiconductor process equipment. Some forms of contamination are so stubbornly attached to the underlying material that removal of the contamination jeopardizes the part to be cleaned. Each of FIGS. 1, 2, and 3 (prior art) illustrates an exemplary component and is used to describe a particular cleaning problem addressed in the following disclosure.

FIG. 1 (prior art) depicts a stainless-steel shield 100 used to contain titanium-bearing vapors during physical vapor deposition (PVD) processes used to deposit layers of titanium and titanium alloys on semiconductor wafers. In confining such vapors, the interior surface 105 of shield 100 becomes highly contaminated with layers of titanium and titanium species, such as titanium nitride. Exterior surface 110 of shield 100 also becomes contaminated, though to a lesser extent. Shield 100 must therefore be periodically cleaned or replaced.

Conventional etchants that attack the titanium and titanium alloys also attack stainless steel. Immersing shield 100 in these etchants to remove the contaminants can therefore damage the underlying stainless steel. Exterior surface 110 is particularly vulnerable because that stainless steel lacks the thick contaminant layer of interior surface 105, and is thus exposed to etchants for a longer time. Pitting and roughening of exterior surface 110 is undesirable for aesthetic purposes and because rough surfaces trap undesirable contaminants when shield 100 is returned to a process chamber. There is therefore a need for a method of effectively removing titanium contaminant species from shield 100 without damaging the underlying stainless steel.

FIG. 2 (prior art) depicts an aluminum blocker plate 200 used to distribute gases evenly over a semiconductor surface. Blocker plate 200 is used, for example, to evenly distribute silicon-bearing gases (e.g. silane) over the surface of a semiconductor wafer during silicon deposition processes. Blocker plate 200 includes a constellation of small holes 205 through which pass the silicon-bearing gas. During such deposition processes, the surfaces of aluminum blocker plate 200, including the inner surfaces of holes 205, become contaminated with silicon and silicon oxides. Blocker plate 200 must therefore be periodically cleaned or replaced.

Oxides of silicon are difficult to remove from aluminum because common silicon etchants vigorously attack aluminum. A similar problem exists for components of or layered with yttrium oxide or sprayed ceramic. Expensive components like blocker plate 200 are therefore discarded and replaced rather than cleaned and reused. There is therefore a need in the art for a way to remove silicon and silicon-bearing contamination from expensive aluminum, yttrium oxide, and sprayed ceramic parts.

FIG. 3 (prior art) depicts a diffusion tube employed in high-temperature furnaces to deposit polysilicon and silicon nitride on semiconductor wafers. Diffusion tube 300 can be of quartz or silicon carbide. During the deposition of polysilicon or silicon nitride, these deposited materials built up on the inner surfaces of diffusion tube 300. After a period of use, the resulting contamination layers can begin to flake off, posing a serious threat of induced defects on the wafers being processed. It is therefore necessary to periodically clean or replace diffusion tube 300.

Unfortunately, current methods of cleaning diffusion tubes are inadequate. In a typical process, one or more "spray balls" are inserted up into a vertically positioned diffusion tube 300. Etchants are then sprayed against the interior surfaces of diffusion tube 300 to dissolve away the accumulated contamination layers. Spray balls do not apply chemicals evenly; therefore contamination removal is slow and uneven. There is therefore a need of improved methods of restoring expensive diffusion tubes to a contamination-free state.

The examples of FIGS. 1-3 are in no way exhaustive of the problems encountered as a result of contaminated semiconductor-processing equipment or of the types of parts that can be cleaned. Many other expensive components pose difficult cleaning problems. For example, some titanium components become contaminated with titanium species, including titanium metal and titanium nitride. Known methods of removing titanium species are labor intensive and potentially damage the underlying titanium substrate. There is therefore a need for methods of removing titanium metal and titanium alloys from titanium substrates.

SUMMARY

The present invention is directed to methods, systems, and chemistries for cleaning various components of semiconductor process equipment. These components are of different types of materials and suffer from different types of contamination. The embodiments described herein remove these contaminants using small amounts of chemicals and with minimal damage to the article being cleaned.

A method in accordance with one embodiment cleans articles with differently contaminated interior and exterior surfaces by using those articles to separate a cleaning vessel into separate chambers, one chamber for the interior surface and one for the exterior surface. Different chemistries are then applied to the differently contaminated surfaces. This embodiment reduces the required volume of etchant, and consequently saves considerably on the purchase, handling, and disposal costs associated with the use of toxic chemicals. One embodiment further reduces the requisite etchant volume using one or more volume-displacement elements that displace some of the etchant volume.

A method in accordance with another embodiment removes layers of stubborn silicon and silicon-nitride contamination from the interior surfaces of articles such as deposition tubes. In such embodiments, a tube to be cleaned is gently rolled on it side while a portion of the tube's interior surface is exposed to an etchant. The tube is only partially filled with etchant to reduce the requisite etchant volume, and the rolling motion evenly exposes the contaminated surfaces to the etchant.

Another embodiment employs hydrofluoric acid to remove titanium species, including titanium metal and titanium nitride, from titanium substrates. Hydrofluoric acid chemistries are traditionally disfavored for such tasks, as hydrofluoric acid tends to attack the underlying titanium substrate. A chemistry in accordance with one embodiment includes a mixture of hydrofluoric acid and hydrogen peroxide that vigorously attacks deposited titanium and titanium nitride without significantly attacking the machined titanium alloys normally used to form titanium components for semiconductor processing. This chemistry can therefore be used to clean expensive titanium parts. In one embodiment, the chemistry found to remove titanium and titanium-bearing contaminants from a titanium substrate without significantly attacking the substrate is a mixture of less than about 2% hydrofluoric acid, from between about 6% and about 30% hydrogen peroxide, and the balance water. This mixture may be selectively applied to contaminated areas.

In accordance with yet another embodiment, a hydrofluoric acid solution is employed to remove silicon species from aluminum, yttrium oxide, and sprayed ceramic substrates. Silicon oxides are relatively inert, and consequently resist most etchants. However, hydrofluoric acid has long been known to be effective at dissolving silicon oxide. Unfortunately, hydrofluoric acid strongly attacks aluminum, yttrium oxide, and sprayed ceramic, and consequently damages expensive components. Methods used in accordance with some embodiments remove silicon and silicon-bearing contaminants from aluminum using a mixture of hydrofluoric acid and anhydrous acetic acid. The hydrofluoric-acid solution used in one embodiment is 51% water and 49% hydrofluoric acid, so the etchant consists primarily of water, hydrofluoric acid, and anhydrous acetic acid.

This summary does not limit the invention, which is instead defined by the claims.

BRIEF DESCRIPTION OF THE FIGURES

FIG. 1 (prior art) depicts a stainless-steel shield 100 used to contain titanium-bearing vapors during physical vapor deposition (PVD) processes used to deposit layers of titanium and titanium alloys on semiconductor wafers.

FIG. 2 (prior art) depicts an aluminum blocker plate 200 used to distribute gases evenly over a semiconductor surface.

FIG. 3 (prior art) depicts a diffusion tube employed in high-temperature furnaces to deposit polysilicon and silicon nitride on semiconductor wafers.

FIGS. 8A and 8B are respective side and from views of a cleaning system 800 similar to system 600 of FIGS. 6A and 6B, like-numbered elements being the same or similar.

DETAILED DESCRIPTION

Figure 4A:
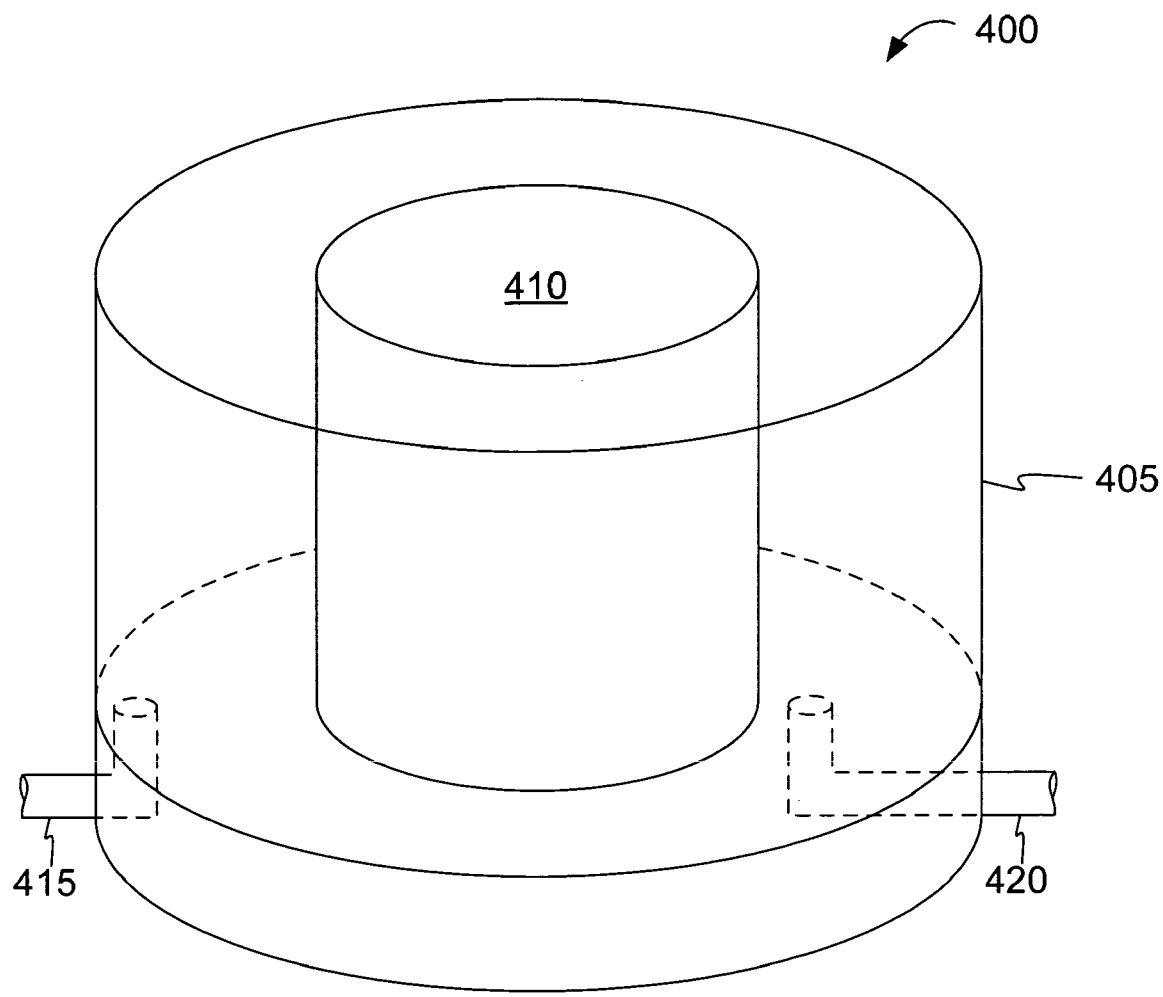
FIG. 4A depicts a volume-efficient cleaning system 400 that addresses the problems of cleaning PVD shield 100 of FIG. 1.

FIG. 4A depicts a volume-efficient cleaning system 400 that addresses the problems of cleaning PVD shield 100 of FIG. 1. Tank 400 includes a containment vessel 405, of volume displacement element 410, a first inlet 415, and a second inlet 420. Inlets 415 and 420 can double as drains, or separate inlets and drains can be provided. In this illustrative example, tank 400 is employed to remove titanium contaminant layers from stainless steel shields of the type depicted in FIG. 1 and described above. The etchant used in the cleaning process includes a mixture of hydrofluoric acid (HF) and hydrogen peroxide ($H_2O_2$). Specific etchant chemistries are detailed below.

Containment vessel 405 and volume displacement element 410 are made of chemically resistant polypropylene, which is easy to clean and does not contribute significant amounts of contamination to the cleaning solution. Volume displacement element 410 is included to minimize the required etchant volume. This aspect of tank 400 is important, as highly pure etchants, such as hydrofluoric acid and hydrogen peroxide, are expensive. The expense of using hydrofluoric acid is exacerbated by the expense of disposal and compliance with environmental regulations that limit the amount of fluorine injected into local sewage systems.

Figure 4B:
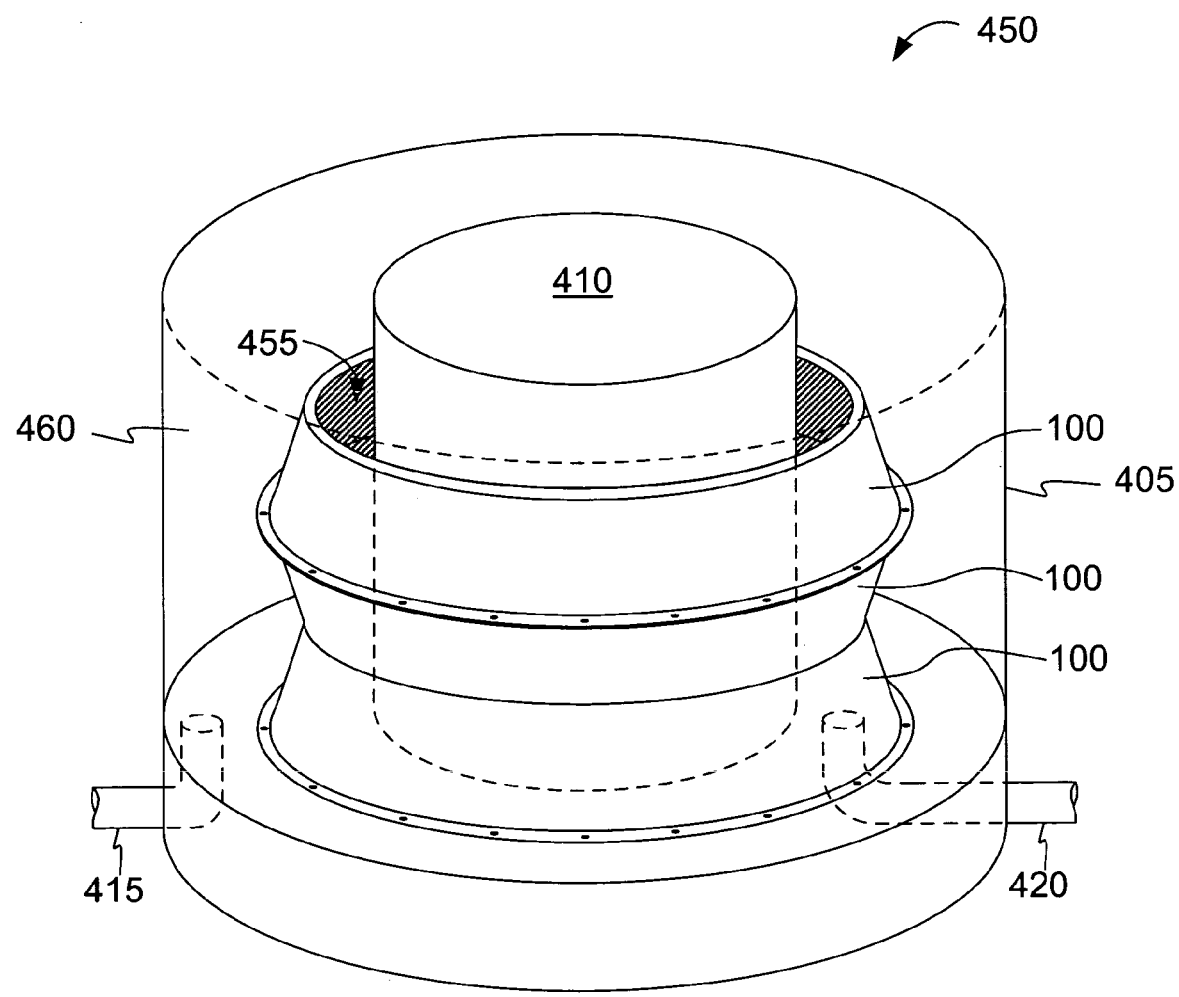
FIG. 4B depicts a cleaning system 450, in which three shields 100 are stacked within containment vessel 405 of tank 400 for cleaning.

FIG. 4B depicts a cleaning system 450, in which three shields 100 are stacked within containment vessel 405 of tank 400 for cleaning. Each of shields 100 includes first and second open ends, the first of which is smaller in diameter than the second. Shields 100 are stacked so that the first open ends from adjacent shields meet and the second open ends from adjacent shields meet. The stacked shields 100 thus collectively form a somewhat cylindrical barrier separating an interior portion 455 of vessel 405 from an exterior portion 460. Interior portion 455 and exterior portion 460 are simultaneously filled via respective inlets 420 and 415, interior portion 455 with a titanium etchant and exterior portion 460 with deionized water. Interior and exterior portions 455 and 460 are filled until the levels of both portions reach the top of the uppermost shield 100. The etchant is then allowed to dissolve or weaken the contamination on the interior surfaces of shields 100.

Filling interior and exterior portions 455 and 460 at the same rate to maintain substantially equivalent fill levels in the interior and external portions maintains an equivalent pressure in those portions, and consequently prevents excessive mixing of the etchant and water. Such mixing can be further limited by providing a gasket material (not shown)

between the bottom shield 100 and the bottom of vessel 405 and between adjacent shields 100. Such sealing is not generally necessary, as a relatively dilute acid solution formed in exterior portion 460 is desirable to attack the relatively light titanium contamination on the exterior surfaces of shields 100. Some embodiments prevent excessive etchant concentration in exterior portion 460 by circulating the water in and out of portion 460 during the cleaning process. The etchant chemistry can also be adjusted during the cleaning process as desired.

As an added advantage, the jacket of water surrounding shields 100 prevents shields 100 from heating excessively in response to the exothermic reaction normally used to remove stubborn titanium deposits. In other embodiments, the temperature of the cleaning process is controlled up or down using a heat exchanger, such as coils of stainless steel or polypropylene tubing, in one or both of exterior portion 460 and interior portion 455. Such embodiments provide the additional advantage of displacing some percentage of either the cleaning solution or the deionized water used in the respective interior and exterior portions, and consequently reduce the amount of chemicals needed for cleaning and the amount of chemicals required for handling and disposal. Though not shown, a cover can be placed over 450 to collect and evacuate hazardous vapors and to protect operators from splashed chemicals.

Different types of cleaning solutions can be used depending on the type of contamination and the item being cleaned. In this embodiment, in which a stainless-steel substrate is contaminated with species of titanium, the use of a particular cleaning chemistry within interior portion 455 has been shown to provide excellent contamination removal while minimizing the damage to the underlying stainless steel. Also important, the chemistry uses a relatively low concentration of hydrofluoric acid, and consequently minimizes disposal costs and environmental impact. This chemistry includes about 60 parts hydrogen-peroxide solution to one part hydrofluoric-acid solution. The hydrogen-peroxide solution used in the chemistries discussed herein is purchased as a ratio of 30% hydrogen peroxide to 70% water, and the hydrofluoric-acid solution is purchased as a mixture of 49% hydrofluoric acid and 51% water. The 60 to 1 mixture is therefore about 29.5% hydrogen peroxide, less than 1% hydrofluoric acid, and the balance water. This mixture may include up to about 5% hydrofluoric acid and from about 6-30% hydrogen peroxide. To minimize the costs of chemicals and their disposal, the preferred ranges of hydrofluoric acid and hydrogen peroxide for removing titanium from stainless steel are from 1-2% hydrofluoric acid and from 10-29% hydrogen peroxide.

Though the articles being cleaned in FIG. 4B are stainless steel, hydrofluoric acid chemistries in accordance with some embodiments are used to remove titanium species, including titanium metal and titanium nitride, from titanium substrates. Conventional methods of removing titanium and titanium nitride employ a combination of chemical and mechanical processes that are collectively very labor intensive. Chemical processes include the use of hydrofluoric acid, but these chemistries are disfavored for use in decontaminating titanium substrates because the chemistries attack the substrates. As a consequence of these shortcomings, very expensive titanium components are routinely discarded.

Applicants discovered an etchant chemistry that removes deposited titanium and titanium nitride from titanium substrates without damaging those substrates. This important chemistry employs a mixture of hydrofluoric acid and hydrogen peroxide that vigorously attacks deposited titanium and titanium nitride without significantly attacking the machined titanium alloys normally used to form titanium components for semiconductor processing. Applicants speculate that the etchant attacks deposited titanium and titanium nitride much more aggressively than the underlying titanium alloy due to compositional differences, physical differences, or both.

An etchant found to remove titanium and titanium-bearing contaminants from a titanium substrate without significantly attacking the substrate is a mixture of less than about 2% hydrofluoric acid, from between about 6% and about 30% hydrogen peroxide, and the balance water. This mixture may be selectively applied to contaminated areas.

Figure 5:
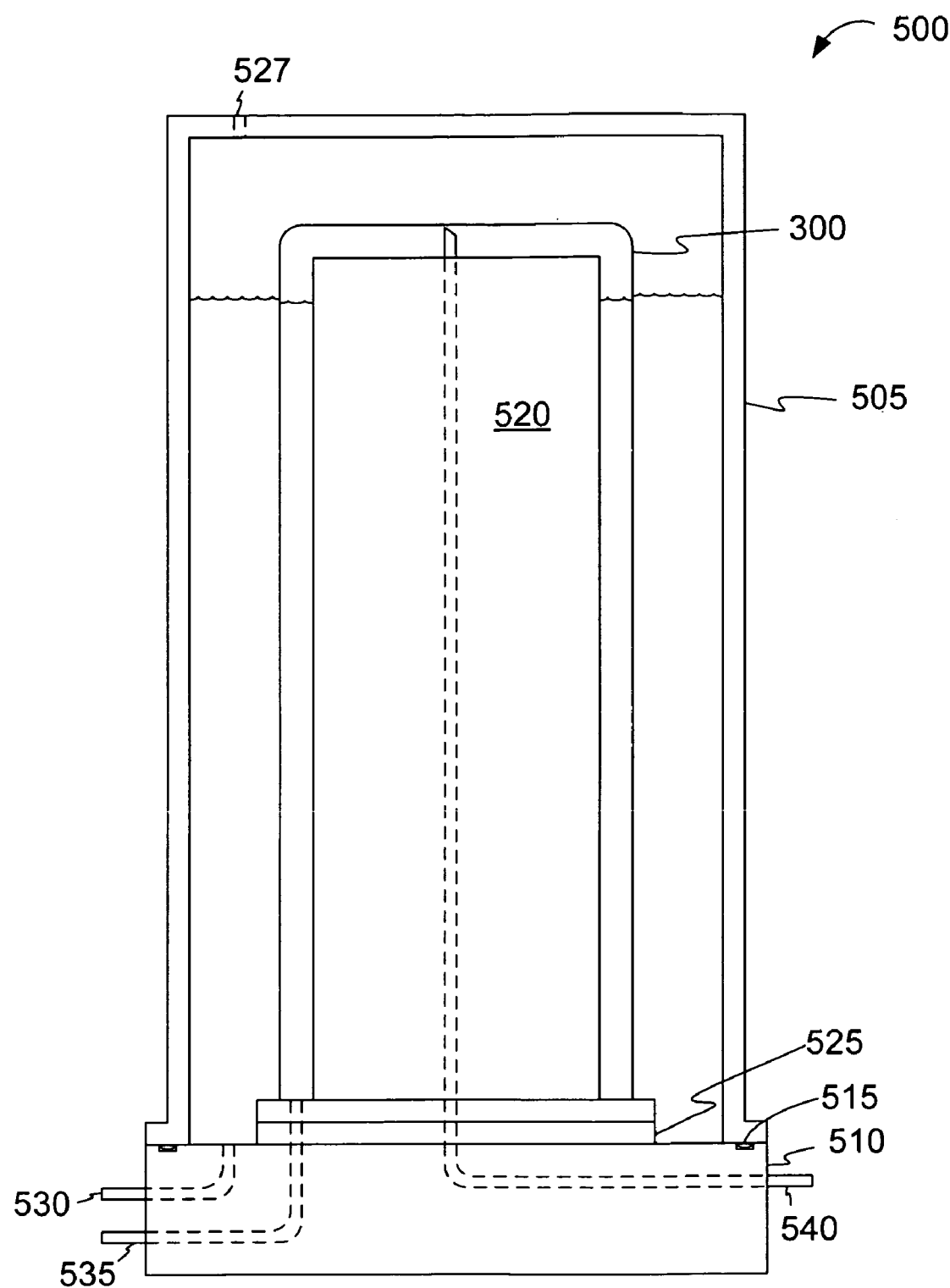
FIG. 5 depicts a cleaning system 500 in accordance with an embodiment that cleans tubes like tube 300 described above in connection with FIG. 3.

FIG. 5 depicts a cleaning system 500 in accordance with an embodiment that cleans tubes like tube 300 described above in connection with FIG. 3. System 500 operates using principles similar to those discussed above in connection with FIGS. 4A and 4B to expose contaminated surfaces to etchants while protecting other surfaces from the etchants, reducing the required volume of etchants, and controlling reaction temperature.

System 500 includes a containment vessel 505 removably attached to a base 510. An O-ring seal 515 prevents liquid from leaking from vessel 505. A volume-displacement element 520 and optional gasket 525 are fixed to base 510. Before cleaning and cooling solutions are added to vessel 505, vessel 505 is removed from base 510 and tube 300 is placed over displacement element 520. Tubes 300 can be heavy and expensive, so some versions of system 500 can be tilted to allow horizontal insertion of tube 300 over displacement element 520. Once system 500 is assembled as shown in FIG. 5, deionized water or some dilute cleaning solution is injected into the region surrounding tube 300 via an inlet 530. An etchant is also injected between the interior surface of tube 300 and volume-displacement element 520 via a second inlet 535. A vent 527 and tube 540 allow air to escape as liquid is injected into containment vessel 505 and tube 300. One or both of vent 527 and tube 540 can be vented for proper disposal of reaction gases.

Gasket 525 prevents the interior and exterior solutions from mixing. A good seal is not necessarily important, however, as maintaining a similar fluid depth inside and outside of tube 300 prevents significant mixing of the interior and exterior fluids. In some embodiments, the fluid level on the outside of tube 300 is maintained somewhat higher than the fluid level inside tube 300 to prevent the etchant from flowing out of tube 300.

As noted above in connection with FIG. 3, typical contaminants on the inside of tube 300 include polysilicon and silicon nitride. These chemicals are conventionally removed using known hydrofluoric acid and nitric acid mixtures. The outside of tube 300 is exposed to deionized water in one embodiment, but other solutions might also be used. In embodiments in which tube 300 is of a different form, of a different material, or contaminated with different materials on different surfaces, the chemistries of the interior and exterior solutions can be changed accordingly.

Figure 6A:
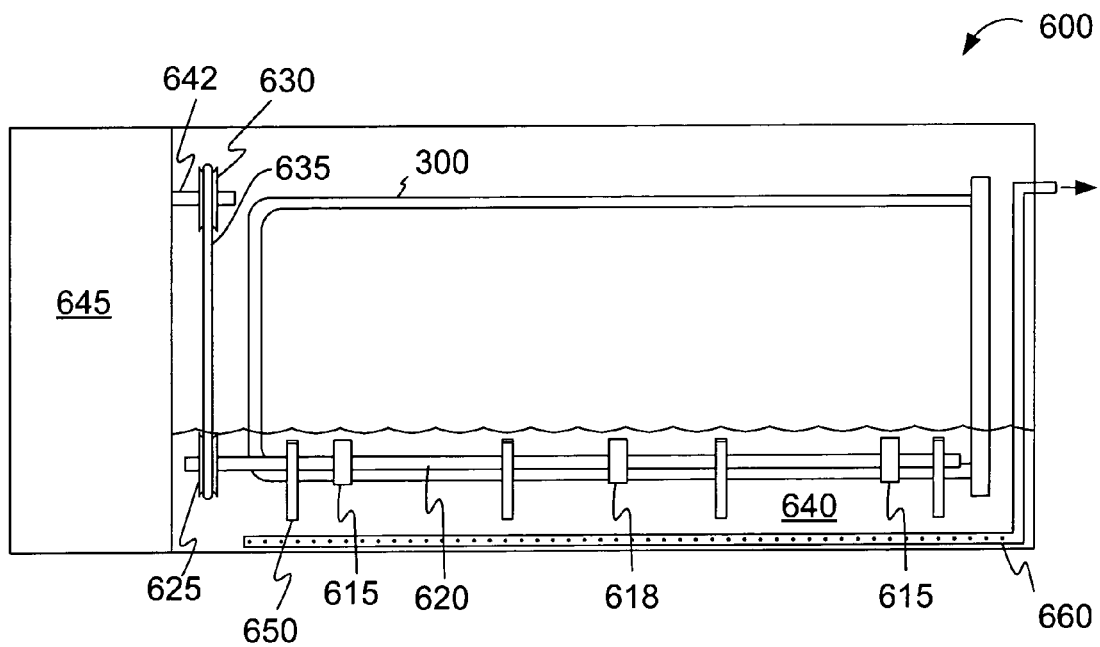
FIGS. 6A and 6B are respective side and front views of a cleaning system 600 in accordance with an embodiment used to clean quartz and silicon carbide tubes 300 of the type described above in connection with FIG. 3.
Figure 6B:
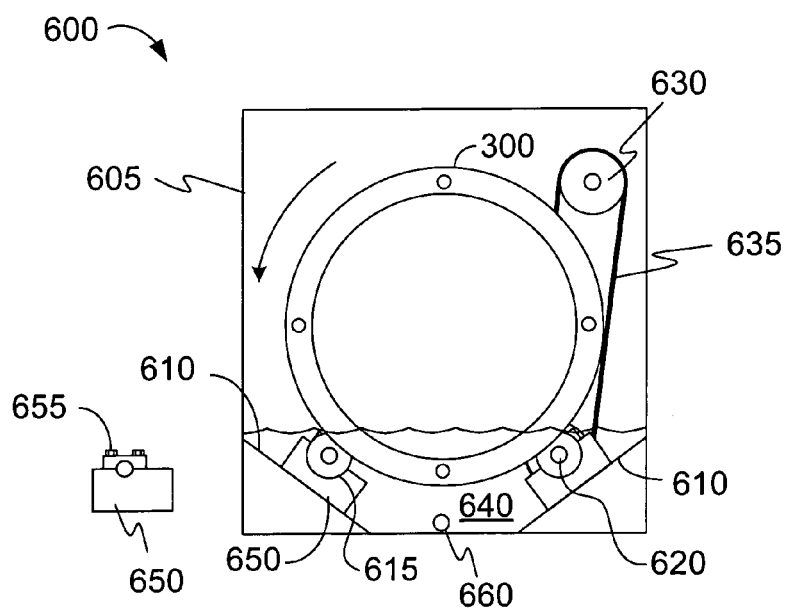

FIGS. 6A and 6B are respective side and front views of a cleaning system 600 in accordance with an embodiment used to clean quartz and silicon carbide tubes 300 of the type described above in connection with FIG. 3. System 600 is adapted to evenly clean the interior surface of tube 300 to remove polysilicon and silicon nitride contamination layers using small volumes of etchants.

System 600 includes a storage vessel 605, typically of a chemically resistant polypropylene. Dams 610 are included at the bottom of vessel 605 to displace some of the etchant. The shape and configuration of dams can be modified as appropriate to optimize the level and amount of etchant and to accommodate different article shapes.

Tube 300 rests on two sets of rollers 615 disposed on a corresponding pair of axles 620. One of axles 620 includes a pulley 625 at one end, and pulley 625 is connected to a corresponding drive pulley 630 via a belt 635. In the depicted embodiment, belt 635 is exposed to an acid-based etchant 640 and is therefore made of an acid-resistant material. In one embodiment belt 635 is a chemically resistant O-ring available from Dupont under the trademark KALREZ or from Greene Tweed Products under the trademark CHEMRAZ.

A driveshaft 642 connected to a motor (not shown) within a motor housing 645 turns pulley 630 and consequently pulley 635, axles 620, and rollers 615. Two sets of journals 650 support axles 620 and are mounted, in this embodiment, to dams 610. The various components of system 600 are made of chemically resistant materials, such as polypropylene or TEFLON. Journals 650, one of which is detailed in FIG. 6B, include two parts joined using chemically inert bolts 655. Finally, a perforated drainpipe 660 near the bottom of vessel 605 or some other form of drain is provided to facilitate removal of etchant 640. Though not shown, vessel 605 can include a lid, and the lid may be vented in a manner that collects potentially harmful vapors.

During operation, tube 300 is rotated slowly to evenly expose the interior surface of tube 300 to etchant 640. An appropriate etchant for removing polysilicon and silicon nitride includes equal volumes of hydrofluoric and nitric acid solutions. Commercially available hydrofluoric and nitric acid solutions include a significant percentage of water.

Figure 7A:
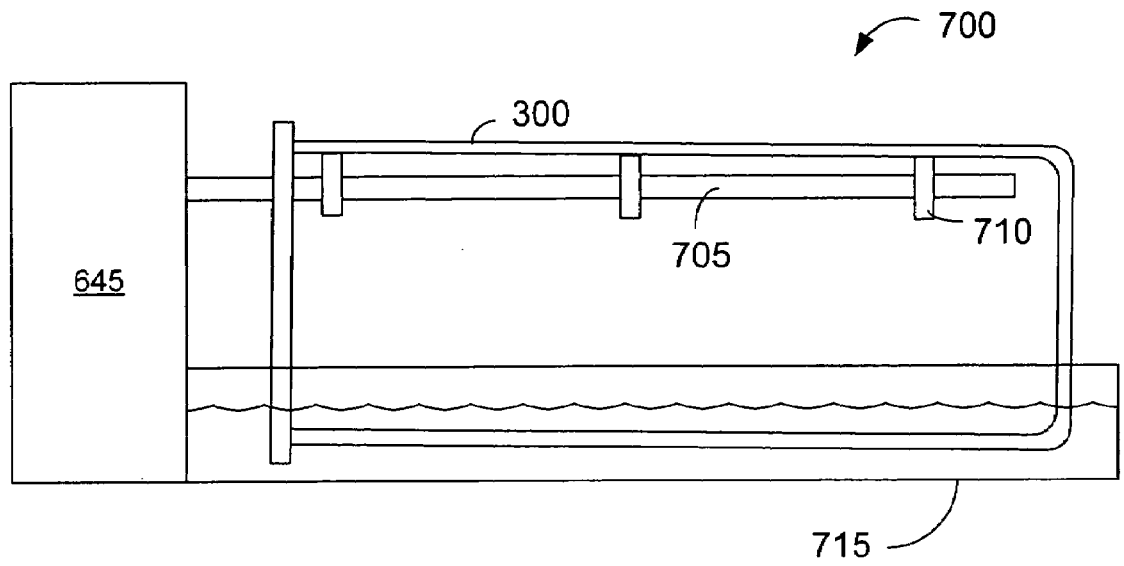
FIGS. 7A and 7B are respective side and front views of a cleaning system 700 in accordance with another embodiment used to clean quartz and silicon carbide tubes 300.
Figure 7B:
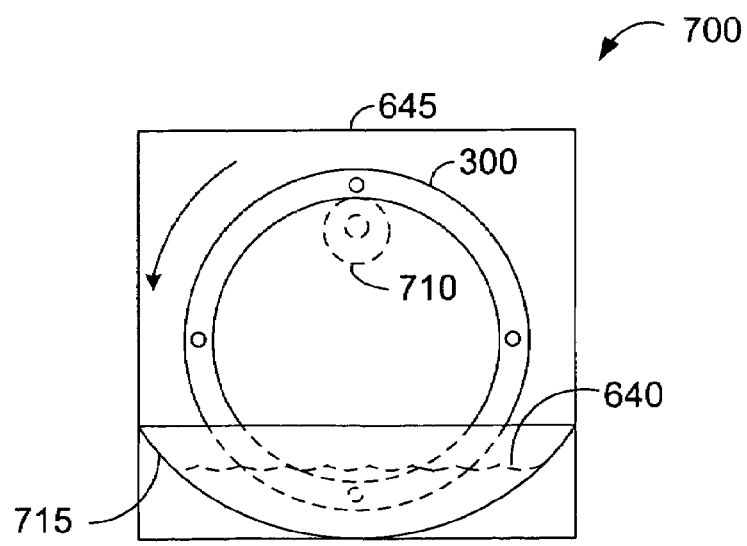

FIGS. 7A and 7B are respective side and front views of a cleaning system 700 in accordance with another embodiment used to clean quartz and silicon carbide tubes 300. System 700 is similar to system 600 of FIGS. 6A and 6B, like-numbered element being the same or similar. In system 700, dams 610 are eliminated; instead, a semi-cylindrical vessel 715 reduces the requisite etchant volume.

In the embodiment of FIGS. 6A and 6B, the rollers, bearings, and belt are exposed to the cleaning solution. In system 700, a single axle 705 supports tube 300 in a manner that isolates the drive mechanism from etchant 640. Tube 300 can be heavy, and axle 705 should be sufficiently rigid to support tube 300. Though not shown, axle supports extending from housing 645 into tube 300 can be added if necessary. Rollers 710 of e.g. TEFLON can also be added to isolate axle 705 from the wet inner surface of tube 300. In other embodiments, rollers 710 are replaced with a chemically inert sleeve that covers a rigid (e.g., stainless steel) axle 705. Though optional, the two end rollers 710 are mildly cam-shaped to move etchant along the length of tube 300. Further, stops can be added to prevent tube 300 from wandering too far on the rollers.

Figure 8A:
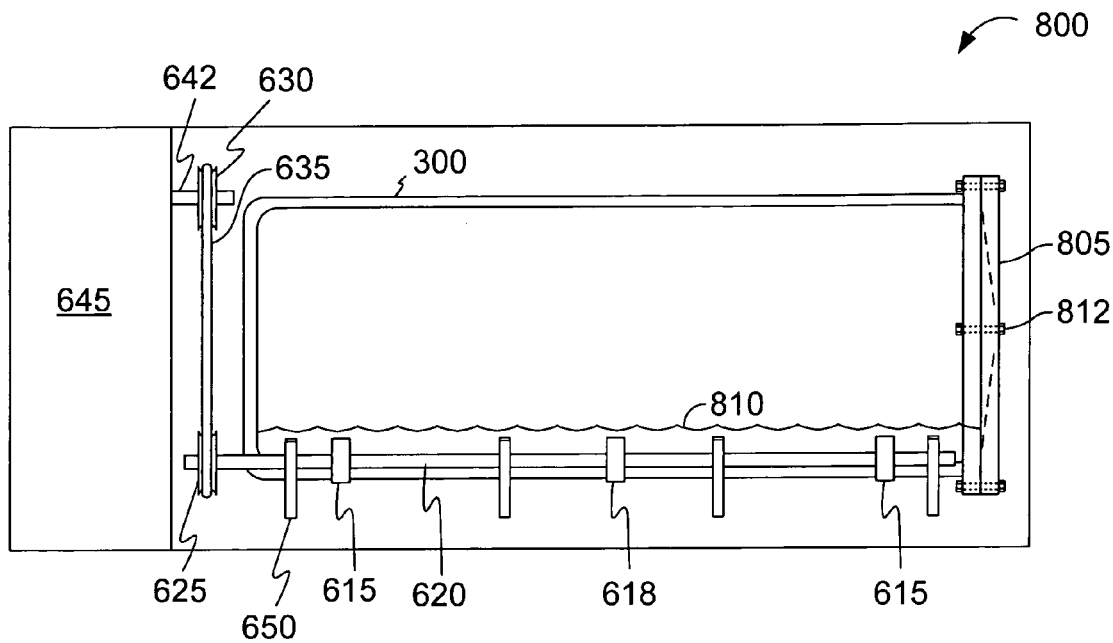
Figure 8B:
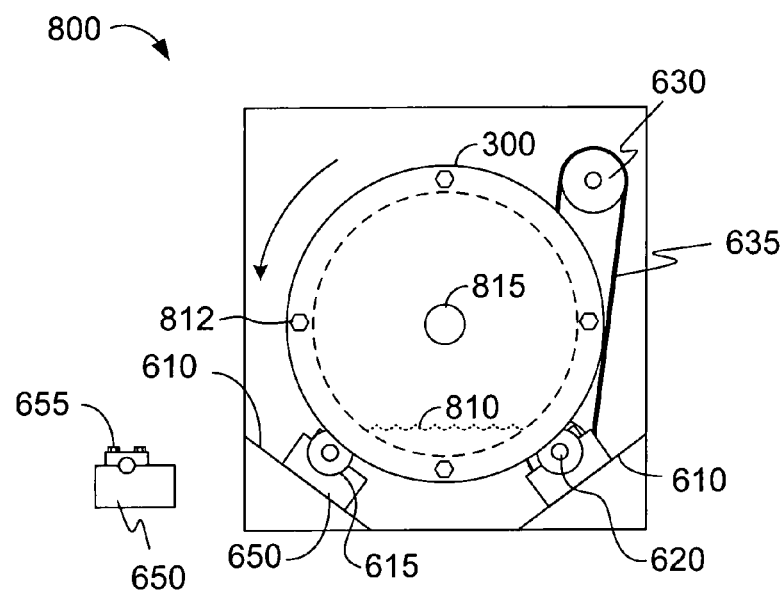

FIGS. 8A and 8B are respective side and front views of a cleaning system 800 similar to system 600 of FIGS. 6A and 6B, like-numbered elements being the same or similar. A cover 805 attached to the bottom end of tube 300 contains etchant 810 so the outer surface of tube 300 is not exposed to etchants. Cover 805 can be of polypropylene and may include a chemically resistance O-ring (not shown) to prevent leakage. Chemically resistant fasteners 812 hold cover in place. A vent 815 may be used to fill and drain tube 300, and additionally serves as a vent for allowing reaction gases to escape. In the depicted embodiment, cover 805 is tapered on the side facing into tube 300 from the outside diameter toward vent 815 to facilitate draining when tube 300 is placed upright. The outer vessel is protected from exposure to etchant, but still serves as secondary containment for spills and can contain e.g. water or a relatively mild cleaning solution to control process temperature and clean the outer surface of tube 300.

As noted above in connection with the discussion of FIG. 2, many expensive semiconductor-processing components are aluminum contaminated with silicon or silicon-bearing compounds. Eventually, this contamination will either impede gas flow or flake off, potentially damaging expensive semiconductor die.

Oxides of silicon are relatively inert, and consequently resist most etchants. However, hydrofluoric acid has long been known to be effective at dissolving silicon oxides. Unfortunately, hydrofluoric acid strongly attacks aluminum, anodized aluminum, yttrium oxide, and sprayed ceramic. Hydrofluoric acid thus damages surfaces made from these materials. Some components can be cleaned using mechanical methods that scrape or blast away exterior silicon contamination, but such methods do not work well for hard-to-reach surfaces, such as the interior surfaces of holes 205 in blocker plate 200 of FIG. 2. Such methods may also remove or damage sensitive coatings, and are consequently difficult to apply to components coated with yttrium oxide or sprayed ceramics.

Methods used in accordance with some embodiments to remove silicon and silicon-bearing contaminants from aluminum employ a hydrofluoric-acid solution prepared by combining hydrofluoric acid with an anhydrous acid. The hydrofluoric acid used in one embodiment is 51% water and 49% hydrofluoric acid, so the etchant consists primarily of water, hydrofluoric acid, and an anhydrous acid.

A possible explanation for the effectiveness of this solution at removing silicon oxides from aluminum substrates without damaging the aluminum is that the high concentration of anhydrous acid deprives the etchant of sufficient free water to attack the aluminum. Whatever the mechanism, this chemistry has been found to remove silicon oxides from aluminum, anodized aluminum, yttrium oxide, and sprayed ceramic surfaces without significantly damaging the underlying material. In one example, an aluminum blocker plate 200 with 0.025 to 0.030 inch diameter holes contaminated with silicon oxide was restored without any significant reduction in hole diameter.

In one embodiment, the hydrofluoric acid solution for removing silicon from aluminum contains between 0.5% and 30% hydrofluoric acid and between 50% and 99% anhydrous acetic acid. If the only water added to the chemistry is provided with the commercially available hydrofluoric acid, then the etchant will typically contain less than about 25% water. A hydrofluoric acid solution is saturated with anhydrous citric acid in another embodiment. Citric acid crystals may, for example, be added.

Figure 9:
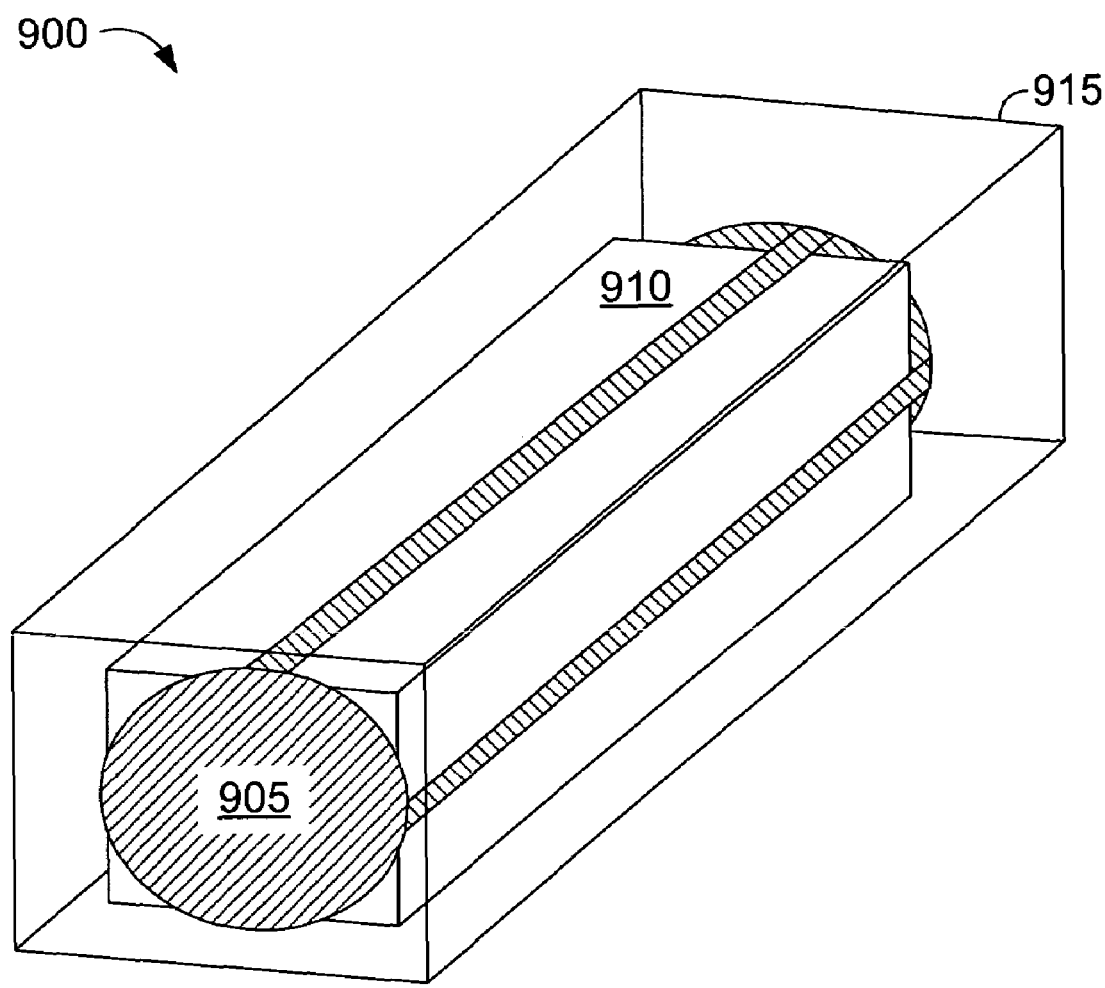
FIG. 9 depicts a cleaning system 900 in accordance with an embodiment adapted to clean a wafer boat 905.

FIG. 9 depicts a cleaning system 900 in accordance with an embodiment adapted to clean a wafer boat 905, typically of quartz or silicon nitride. The chemistries employed are conventional, but a displacement element 910 is added to a container 915 to displace a significant percentage of the liquid used in cleaning. In one embodiment, for example, displacement element 910 displaces over thirty gallons, reducing the liquid required to cover wafer boat 905 from over forty gallons to about seven gallons.

While the present invention has been described in connection with specific embodiments, variations of these embodiments will be obvious to those of ordinary skill in the art. For example, while the contaminated articles are round in the forgoing examples, differently shaped parts and correspondingly shaped vessels and volume-displacement elements might also be used; and the methods described in connection with FIGS. 5-8B can be applied to other types of cylindrical and substantially cylindrical parts, including e.g. cylindrical shields conventionally used inside deposition tubes. Therefore, the spirit and scope of the appended claims should not be limited to the foregoing description.

What is claimed is:

1. A cleaning system comprising:
   a. a cylindrical deposition chamber having an interior surface bearing a contamination layer, an exterior surface of an exterior chamber diameter, and an interior chamber length;
   b. a vessel containing the deposition chamber and a cleaning solution including hydrofluoric acid, the vessel filled with the cleaning solution to a first level;
   c. at least one roller supporting and in physical contact with the deposition chamber such that the deposition chamber is partially submerged in the cleaning solution to expose a portion of the interior surface to the cleaning solution;
   d. wherein the portion of the interior surface exposed to the cleaning solution extends at least partially along the interior chamber length;
   e. a drive mechanism coupled to the roller; and
   f. at least one volume-displacing element disposed in the vessel, the volume-displacing element not in physical contact with the deposition chamber;
   g. wherein the at least one roller is cam-shaped.

2. The cleaning system of claim 1, wherein the portion of the interior surface exposed to the cleaning solution is substantially less than half of the total interior surface area.

3. A cleaning system comprising:
   a. a cylindrical deposition chamber having an interior surface bearing a contamination layer, an exterior surface of an exterior chamber diameter, and an interior chamber length;
   b. a vessel containing the deposition chamber and a cleaning solution including hydrofluoric acid, the vessel filled with the cleaning solution to a first level;
   c. at least one cam-shaped roller supporting the deposition chamber and in contact with the interior surface such that the deposition chamber is suspended from the roller and partially submerged in the cleaning solution to expose a portion of the interior surface to the cleaning solution;
   d. wherein the portion of the interior surface exposed to the cleaning solution extends at least partially along the interior chamber length; and
   e. a drive mechanism coupled to the roller.

4. The cleaning system of claim 3, wherein the vessel is curved.

5. A cleaning system comprising:
   a. a diffusion tube having an interior surface bearing a contamination layer, an exterior surface, and an interior chamber length;
   b. a vessel containing the diffusion tube and a cleaning solution including hydrofluoric acid, the vessel filled with the cleaning solution to a first level partially submerging the diffusion tube in the cleaning solution and exposing a portion of the interior surface to the cleaning solution, wherein the portion of the interior surface exposed to the cleaning solution extends at least partially along the interior chamber length;
   c. at least one cam-shaped roller supporting and in physical contact with the diffusion tube; and
   a drive mechanism coupled to the roller to rotate the roller;
   e. wherein the portion of the interior surface exposed to the cleaning solution is substantially less than half of the total interior surface area.

6. The cleaning system of claim 5, further comprising at least one volume-displacing element disposed in the vessel, the volume-displacing element not in physical contact with the diffusion tube.

7. The cleaning system of claim 5, wherein the diffusion tube is suspended from the roller, and wherein the roller is in contact with the interior surface.

8. The cleaning system of claim 5, wherein the at least one roller is at least partially submerged in the cleaning solution.

9. The cleaning system of claim 5, wherein the drive mechanism is coupled to the roller via an axle.

10. The cleaning system of claim 9, wherein the roller is disposed between the axle and the diffusion tube.

11. The cleaning system of claim 9, further comprising a second axle substantially parallel to the first-mentioned axle.

* * * * *

UNITED STATES PATENT AND TRADEMARK OFFICE
CERTIFICATE OF CORRECTION

| | | |
|---|---|---|
| PATENT NO. | : 7,267,132 B2 | Page 1 of 1 |
| APPLICATION NO. | : 11/054794 | |
| DATED | : September 11, 2007 | |
| INVENTOR(S) | : David S. Zuck | |

It is certified that error appears in the above-identified patent and that said Letters Patent is hereby corrected as shown below:

Title Page, Item (57) Abstract, Line 5 the word "it" should be changed to --its--

Title Page, Item (57) Abstract, Line 5 the word --of-- should be added after the word "portion"

Column 2, Line 26 the word "built" should be changed to --build--

Column 3, Line 12 the word "it" should be changed to --its--

Column 4, Line 14 the word "from" should be changed to --front--

Signed and Sealed this

Fifteenth Day of April, 2008

JON W. DUDAS
*Director of the United States Patent and Trademark Office*